(12) United States Patent
Humphries et al.

(10) Patent No.: US 7,098,560 B2
(45) Date of Patent: Aug. 29, 2006

(54) FLUX PROBE FOR ELECTRIC GENERATOR

(75) Inventors: Benjamin Todd Humphries, Orlando, FL (US); William Gene Morgan, Sanford, FL (US); George F. Dailey, Pittsburgh, PA (US)

(73) Assignee: Siemens Power Generation, Inc., Orlando, FL (US)

( * ) Notice: Subject to any disclaimer, the term of this patent is extended or adjusted under 35 U.S.C. 154(b) by 0 days.

(21) Appl. No.: 10/854,917

(22) Filed: May 27, 2004

(65) Prior Publication Data

US 2005/0264110 A1    Dec. 1, 2005

(51) Int. Cl.
*H02K 11/00* (2006.01)
*H02K 3/487* (2006.01)
*G01R 33/00* (2006.01)

(52) U.S. Cl. .................. 310/68 R; 310/214; 324/200; 324/260

(58) Field of Classification Search .......... 310/68 B, 310/68 R, 114–116, 214–216; 702/182–185; 324/772, 545, 260
See application file for complete search history.

(56) References Cited

U.S. PATENT DOCUMENTS

| | | | | |
|---|---|---|---|---|
| 2,939,074 A | * | 5/1960 | Perrett | 324/545 |
| 3,624,504 A | * | 11/1971 | Joly | 324/138 |
| 3,855,529 A | * | 12/1974 | Langweiler | 324/772 |
| 4,011,489 A | * | 3/1977 | Franz et al. | 318/798 |
| 4,136,312 A | * | 1/1979 | Salon et al. | 324/545 |
| 4,140,933 A | * | 2/1979 | Wambsgannss et al. | 310/68 R |
| 4,164,705 A | * | 8/1979 | Whitney et al. | 324/772 |
| 4,230,961 A | * | 10/1980 | Calfo et al. | 310/68 R |
| 4,506,218 A | * | 3/1985 | Brown et al. | 324/772 |
| 4,667,148 A | | 5/1987 | Albright et al. | |
| 5,680,059 A | * | 10/1997 | Shiota et al. | 324/772 |
| 6,346,810 B1 | * | 2/2002 | Cho et al. | 324/244.1 |
| 6,466,009 B1 | | 10/2002 | Dehaan et al. | |
| 6,791,351 B1 | * | 9/2004 | Fischer et al. | 324/772 |
| 6,798,210 B1 | * | 9/2004 | Goodrich et al. | 324/510 |
| 6,847,224 B1 | * | 1/2005 | Lee et al. | 324/772 |

FOREIGN PATENT DOCUMENTS

| | | | |
|---|---|---|---|
| GB | 2044936 A | * | 10/1980 |
| JP | 1-269072 | * | 10/1989 |
| RU | 2082274 | * | 6/1997 |

OTHER PUBLICATIONS

"Resistance Thermometers for Inserting into Grooves"; General Information; www.temperatur.com; Dec. 8, 2003.

* cited by examiner

*Primary Examiner*—Burton Mullins

(57) ABSTRACT

A flux probe (100) for measuring the rotor flux of an electric generator (10). The probe (100) is affixed to a probe carrier (102) and held within a stator coil slot (62) by affixing the carrier (102) to two opposing grooves (104) formed in sidewalls (81) of the slot (62). One or more stator coils (18) are also disposed in the slot (62) and retained therein by a wedge (74) and corresponding spring (72) that applies an radially outwardly directed force to the coils (18). In one embodiment the probe carrier (102) is affixed to a radially inwardly directed face (82) of the wedge (74).

15 Claims, 5 Drawing Sheets

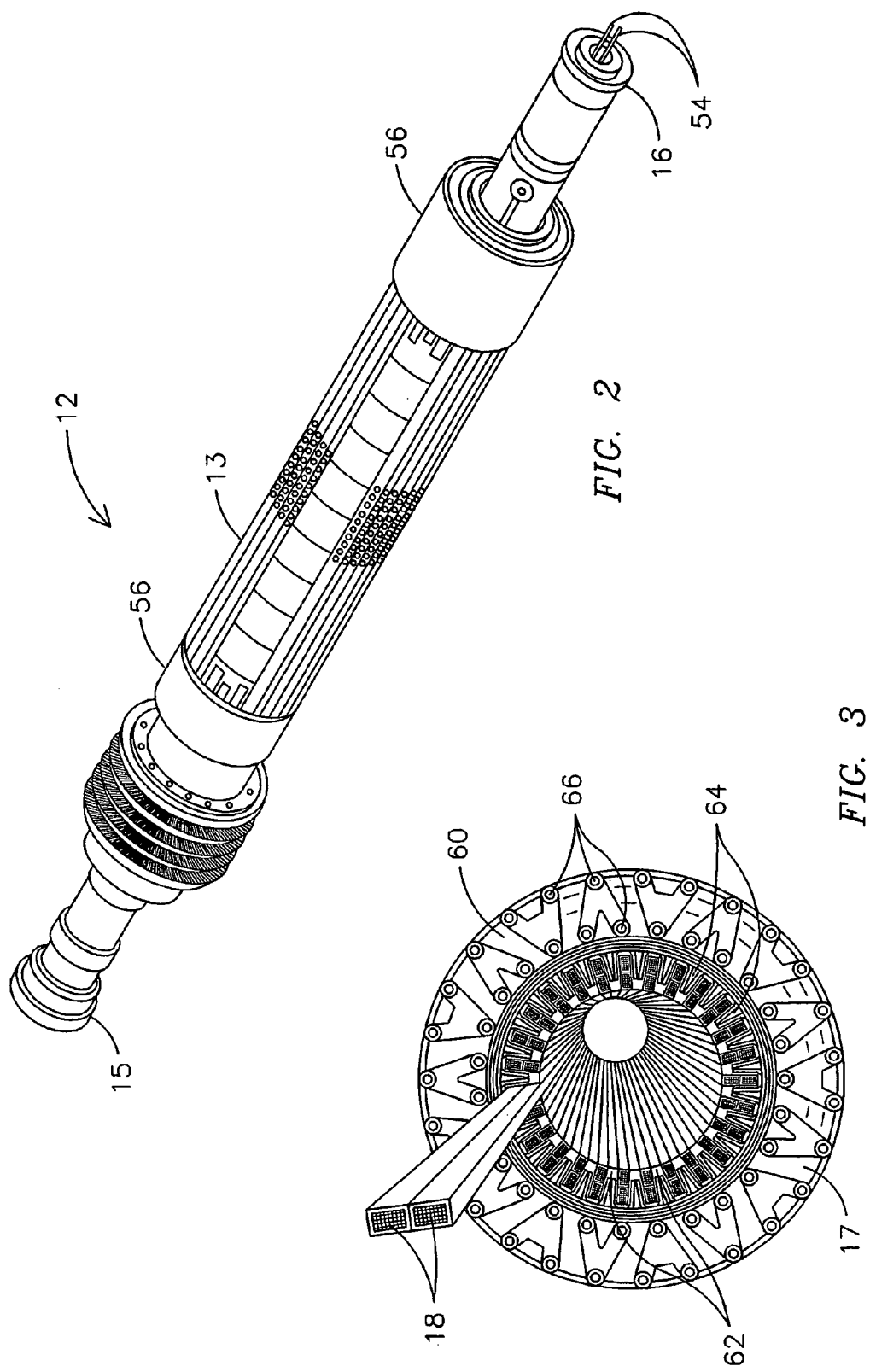

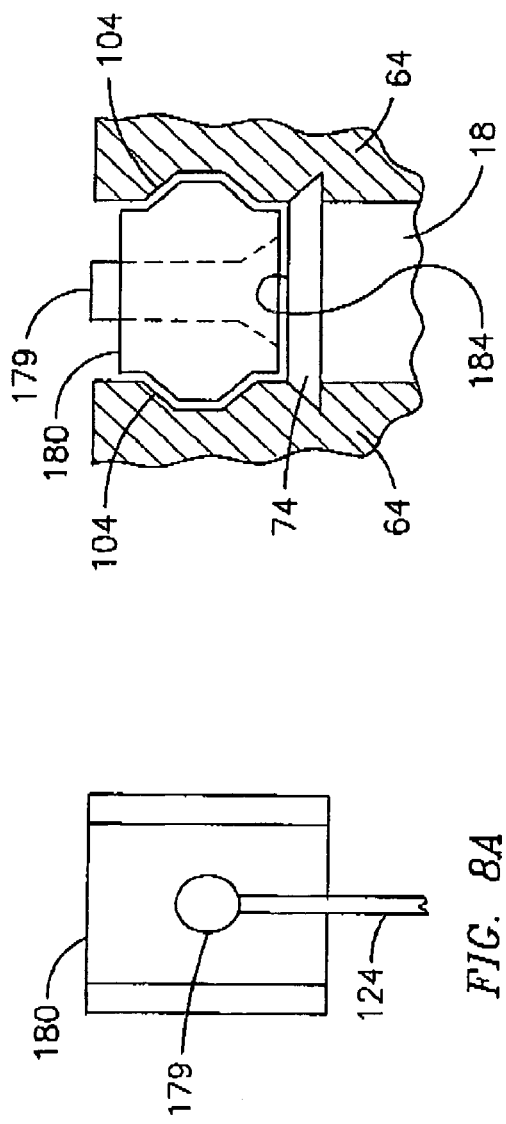
FIG. 8A
FIG. 8B
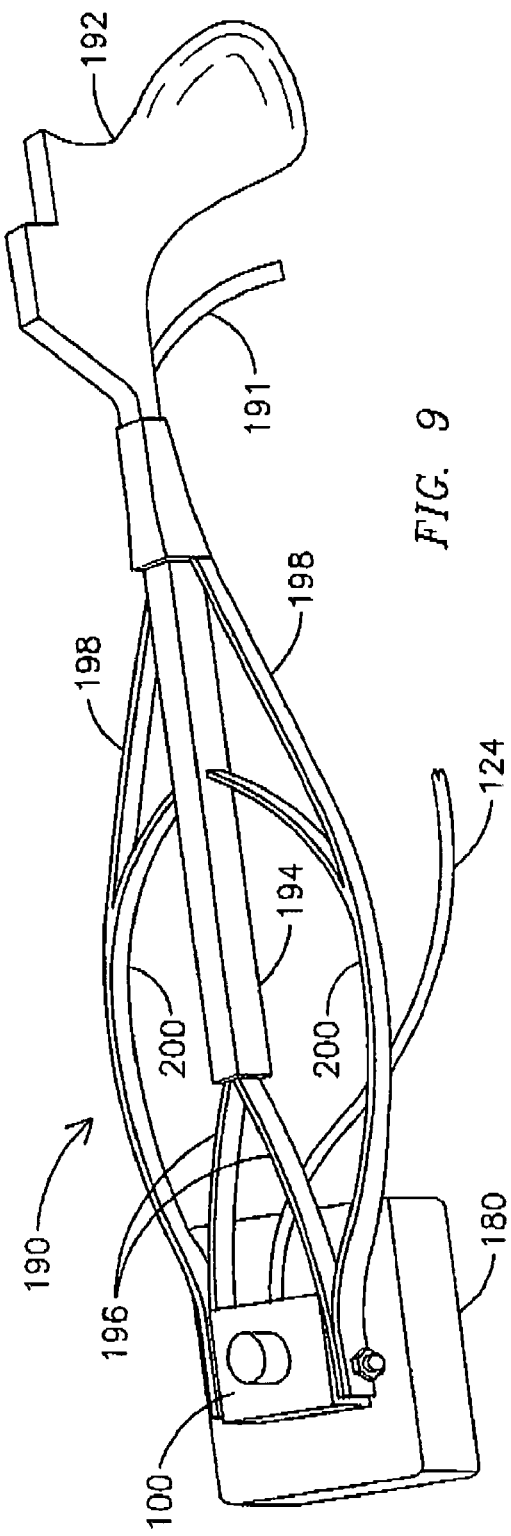
FIG. 9

FLUX PROBE FOR ELECTRIC GENERATOR

FIELD OF THE INVENTION

The present invention relates generally to magnetic flux probes for measuring the magnetic flux produced by an electric generator rotor, and more specifically to a flux probe adapted for installation without requiring removal of the rotor from the generator and to a method for installing the flux probe.

BACKGROUND OF THE INVENTION

As shown in FIG. 1, a conventional electric generator 10 comprises a generally cylindrical rotor 12 carrying axial field or rotor windings (also referred to as rotor turns) 13 about the circumference thereof. Current flow through the field windings 13 generates a magnetic field within a stationary armature or stator 14. One end 15 of the rotor 12 is drivingly coupled to a steam or gas-driven turbine (not shown in FIG. 1) for supplying rotational energy to turn the rotor 12 and causing rotation of the magnetic field produced thereby. According to known dynamoelectric principles, the rotating magnetic field of the rotor 12 induces current flow in stator windings 18 (only one stator winding 18 is illustrated in FIG. 1) of the stator 14. An end 16 of the rotor 12 is coupled to an exciter (not shown) for supplying direct current to the rotor windings 13 to produce the aforementioned magnetic field.

The stator 14 has a generally cylindrical shape and an annular traverse cross section defining a longitudinal bore extending there through for accepting the rotor 12, which thereby extends substantially the longitudinal length of the stator 14. The stator 14 comprises a core 17 further comprising a plurality of thin, generally annular high-permeability laminations disposed in side-by-side orientation. Each lamination comprises an insulative coating such that two adjacent laminations are electrically insulated to reduce eddy current flow within the core 17. The alternating current generated in the stator windings 18 by action of the rotating magnetic field of the rotor 12 is conducted to main generator leads 19 for supplying the generated current to an external electrical load. The stator windings 18 are connected through end turns 20. A gap 21 formed between the rotor 12 and the stator 14 typically measures between about one and two inches.

The rotor 12 and the stator 14, and other generator components not directly relevant to the present invention, are enclosed within a frame 23.

FIG. 2 illustrates rotor axial leads 54 through which the direct current generated by the exciter is coupled to the rotor windings 13. A conventional two-pole rotor comprises eight to eighteen axial slots each carrying a plurality of mutually insulated conductive bars that are symmetrically oriented along the rotor circumference. For example, one rotor design comprises fourteen slots such that one rotor pole comprises seven slots. The conductive bars comprising a pole are interconnected by end turns, i.e., arcuate winding segments located at a rotor end for connecting the axially disposed conductive bars. The end turns are physically restrained by retaining rings 56.

FIG. 3 is a cross-sectional view of the stator 14, illustrating a face 60 of one lamination of the stator core 17 and circumferential stator slots 62 defined by inwardly-directed circumferential teeth 64 extending axially along the stator 14. The stator windings 18 are disposed within the slots 62 between two adjacent teeth 64. Bolt/nut combinations 66, or similar fasteners, extend axially through and secure the laminations to form the stator core 17.

As illustrated more clearly in the partial view of FIG. 4, the stator core 17 comprises a plurality of stacked laminations 67. Two adjacent stator teeth 64 (only one is shown in FIG. 4) formed in the laminations 67 define stator slots 62 for receiving the stator windings 18. Typically, two stator windings 18 are disposed within each slot 62. The two stator windings 18 are retained within the slot 62 by a shim 70, a ripple spring 72 and a wedge 74 having opposed beveled edges 76 for engaging correspondingly shaped grooves 80 in sidewalls 81 of the teeth 64. The ripple spring 72 is compressed between the wedge 74 and the shim 70 to apply a radially outwardly directed force retaining the two stator windings 18 in place within the slot 62.

It is known that a shorted rotor winding turn reduces the magnetic flux and modifies the power dissipation profile of the rotor windings. Such changes in power dissipation can produce non-uniform heating of the rotor windings, resulting in thermally induced rotor distortion and vibration that can damage the rotor and other generator components. The vibrations may also excite the natural resonant frequencies of generator components, including the pad on which the generator is mounted. Pad vibration can lead to severe damage to the generator.

The primary cause of a short circuit is the breakdown of insulation separating the conductor bars or end turns of the rotor, by wearing of the rotor winding insulation or slot cell insulation that separates the rotor windings. The short circuits may occur only when the rotor is at rest or only when the rotor windings and end turns are subjected to centrifugal forces caused by rotation. The former type of short circuit can be detected by known static tests, while the latter can be detected only while the rotor is turning at or near its operational speed.

The considerable economic value of a generator and the high cost of replacing generated power during a generator service outage encourages an owner to continue operating the generator so long as operation is safe and will not likely damage the generator. A single shorted rotor turn can generally be tolerated, although it may be necessary for the operator to add balance weights to compensate the vibration levels under different operating conditions. If the vibrations cannot be eliminated by rotor balancing it may be necessary to shut down the generator and remove the rotor to determine the location of each short and repair the affected rotor winding. Also, if the rotor windings develop several shorts the short circuit current can flow through the rotor body. The rotor body may be damaged by this current flow and will thus require a substantial repair effort.

One technique for locating rotor short circuits uses a stator-mounted flux probe for measuring the rotor magnetic field flux, from which, using known techniques, the operator can determine the existence and location of rotor winding shorts. According to this prior art process, installation of the flux probe requires removal of the rotor to access the stator and mount the probe thereto. In one embodiment, the probe is bonded and pinned, using dowel pins for example, to a radially inwardly directed face 82 of the stator wedge 74 of FIG. 4. The rotor is then replaced and the generator returned to service. Once operational again, probe signals indicative of the rotor's magnetic field are analyzed to determine the location of the short circuit. Such a prior art probe installation process is an expensive and time consuming undertaking for the generator operator, requiring a shut down duration of several days. The cost of the shutdown, with respect to both the process for installing the probe and the cost for replacement power can be considerable. Once the location of the short is determined, the generator is again shutdown, the rotor removed and the necessary rotor repairs performed.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIG. 2 illustrates a perspective view of a rotor of the electric generator of FIG. 1;

FIG. 3 illustrates a radial cross section of a stator of the electric generator of FIG. 1;

FIGS. 8A and 8B illustrate plan and elevation views of a fourth embodiment of a flux probe according to the present invention; and FIG. 9 illustrates a tool for inserting the flux probe according to the present invention.

DETAILED DESCRIPTION OF THE INVENTION

Figure 1:
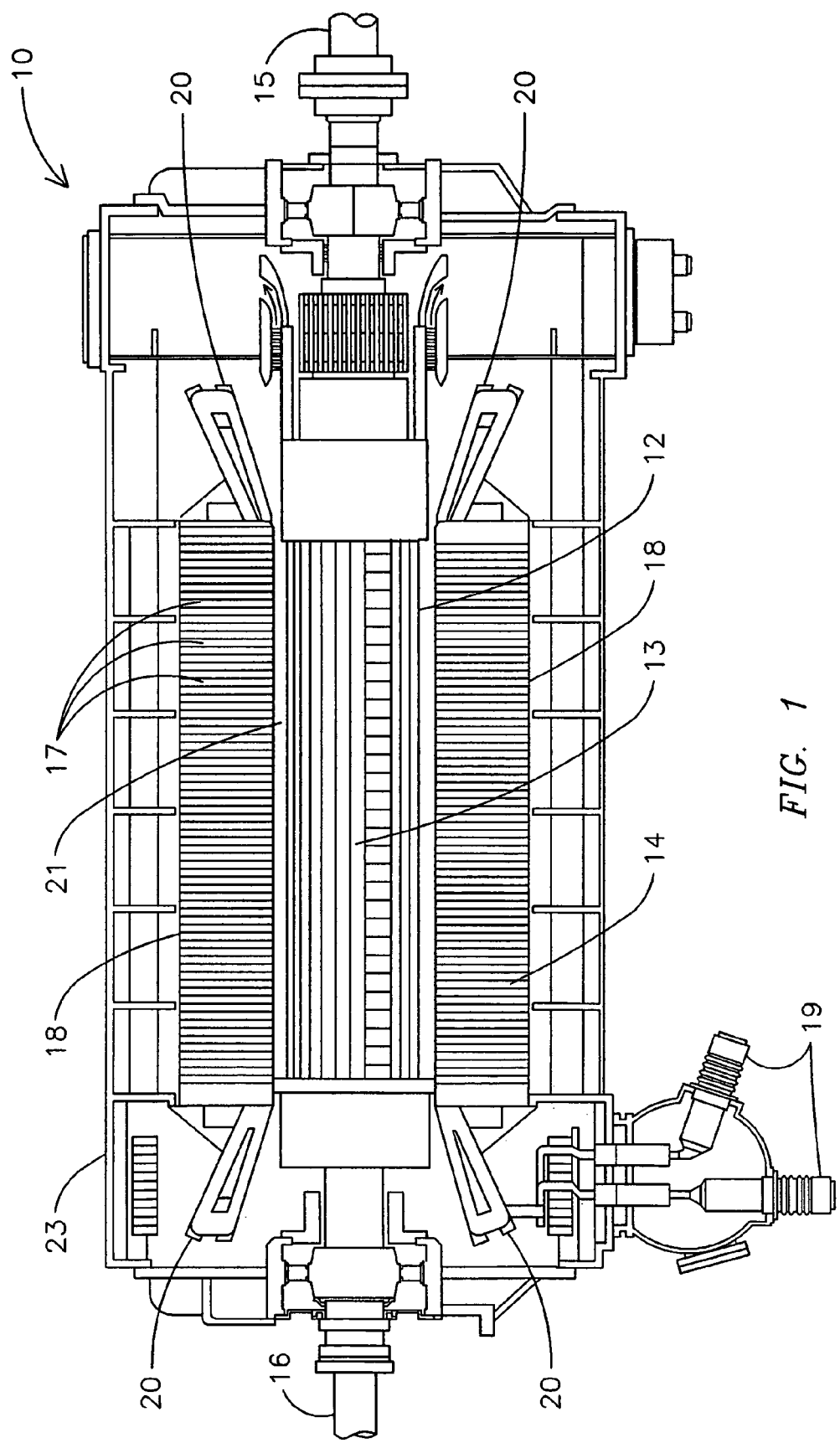
FIG. 1 illustrates an axial cross-sectional view of an electric generator.
Figure 4:
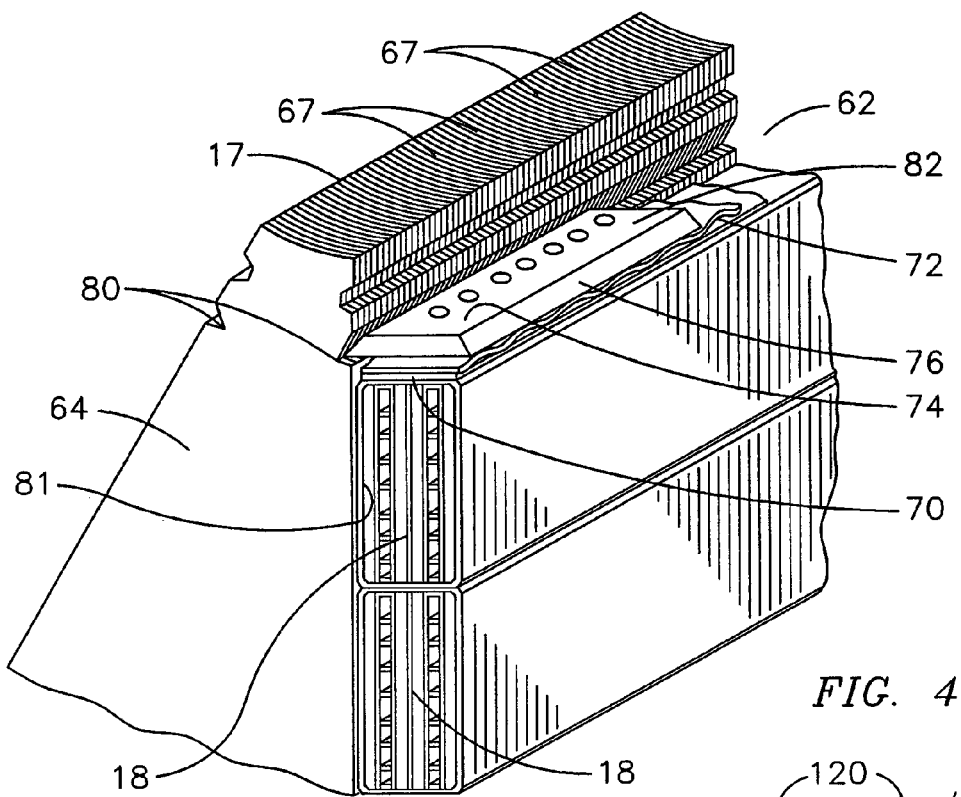
FIG. 4 illustrates a partial view of the stator of FIG. 3.

Before describing in detail the particular flux probe mounting apparatus and method in accordance with the present invention, it should be observed that the present invention resides primarily in a novel and non-obvious combination of hardware elements and method steps. Accordingly, these elements and steps have been represented by conventional elements and steps in the drawings, showing only those specific details that are pertinent to the present invention so as not to obscure the disclosure with details that will be readily apparent to those skilled in the art having the benefit of the description herein.

Figure 5A:
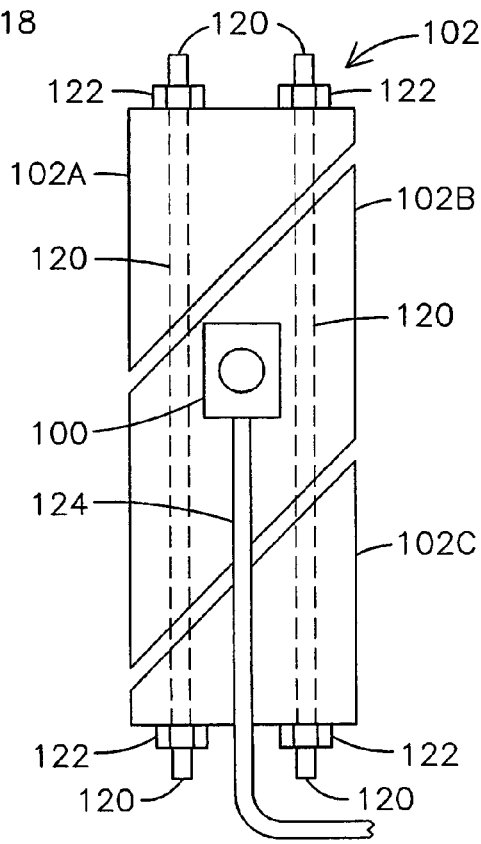
FIGS. 5A and 5B illustrate plan and elevation views of a first embodiment of a flux probe according to the present invention.
Figure 5B:
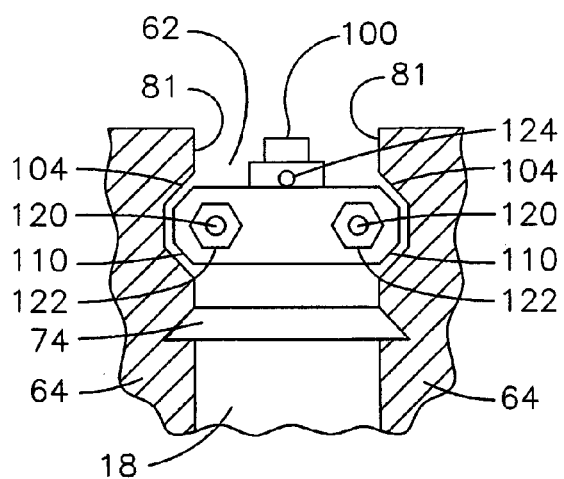

According to the teachings of the present invention, as illustrated in the plan view of FIG. 5A and the elevation view of FIG. 5B, a flux probe 100 is attached to a carrier 102 (by for example, pinning, bonding or fastening with any known fastening device) that is in turn mounted within opposing tooling wedge grooves 104 formed in sidewalls 81 of two adjacent teeth 64. After insertion, the flux probe 100 is positioned at an appropriate axial location of the generator 10 to measure the rotor magnetic flux, from which the existence of a rotor short can be determined. Generally, the probe is positioned in a region of the rotor 12 between the end turns for detecting a short at any axial location of a rotor winding.

Installation of the flux probe 100 according to the teachings of the present invention requires removal of only the generator end frame to provide access to the stator slot 62. Thus removal of the rotor is avoided, offering the generator operator a substantial cost savings due to the need for only a relatively brief service outage.

According to one embodiment of the present invention as illustrated in FIG. 5A, the carrier 102 comprises three mating segments 102A, 102B and 102C each having opposing-double-beveled edges 110 (see FIG. 5B) for mating with a corresponding tooling wedge groove 104. As shown, the flux probe 100 is mounted on one of the three segments, for example the carrier segment 102B, by any known technique, including bonding using an adhesive material. Two threaded studs 120 are disposed within axially directed oversized or slotted holes in the segments 102A, 102B and 102C for threadable engagement with cooperating nuts 122. After the carrier 102 and the attached flux probe 100 are properly inserted within the opposing tooling wedge grooves 104, the studs 120 are tightened relative to the nuts 122, urging the double-beveled edges 110 of the segments 102A, 102B, and 102C against surfaces defining the grooves 104. In another embodiment the stud 120 is threadably engaged with one or more of the wedge segments 102A, 102B and 102C.

One or more wires 124 carrying a signal representing the rotor magnetic flux extend from the probe 100 along the carrier segments 102B and 102C and then are directed external to the generator. The wires 124 are terminated in various known signal processing and monitoring devices for determining the existence of winding shorts in the rotor 12 according to known techniques.

Figure 6A:
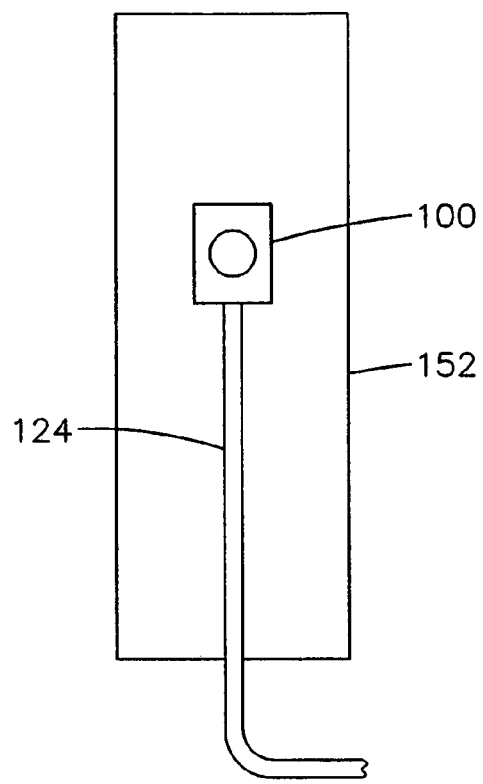
FIGS. 6A and 6B illustrate plan and elevation views of a second embodiment of a flux probe according to the present invention.
Figure 6B:
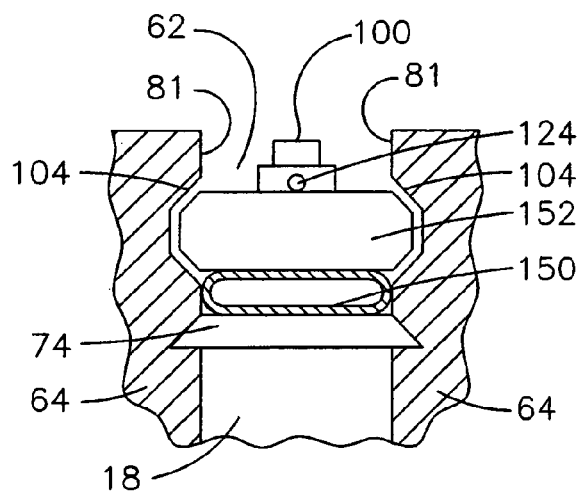

In another embodiment illustrated in FIGS. 6A and 6B, a bladder 150 is installed below a carrier 152 to which the flux probe 100 is mounted. After probe installation, the bladder 150 is filled with a liquid epoxy resin material that cures and hardens to apply an upwardly-directed force to the carrier 152, urging the carrier 152 against walls defining the tooling wedge grooves 104, thereby securing the probe 100 in place.

Figure 7A:
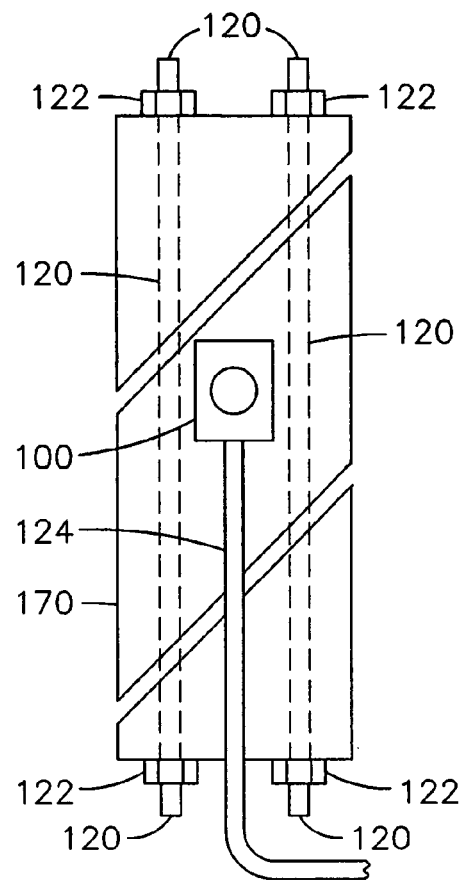
FIGS. 7A and 7B illustrate plan and elevation views of a third embodiment of a flux probe according to the present invention.
Figure 7B:
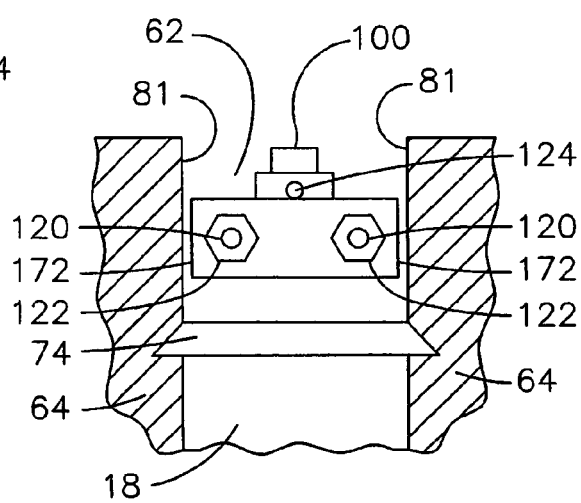

In yet another embodiment illustrated in FIGS. 7A and 7B, the tooling wedge grooves are absent and thus a carrier 170 comprises substantially flat axial side surfaces 172, which are urged against the sidewalls 81 as the stud/nut combinations 120/122 are tightened.

In another embodiment illustrated in FIGS. 8A and 8B a probe 179 is mated with a carrier 180. In one embodiment, the mating is accomplished by inserting the probe 179 into an opening formed in the carrier 180 and bonding the mating surfaces with an appropriate bonding material. The carrier 180 is bonded to the tooling wedge grooves 104 and/or to an upper surface 184 of the wedge 74. Any suitable epoxy or adhesive material can be used to affect the bond.

A tool 190 illustrated in FIG. 9 comprises a trigger 191 movably affixed to a handle 192 further connected to a hollow rod 194 that slidably encloses two fingers 196. Application of a trigger force to the trigger 191 withdraws the two fingers 196 into the rod 194, applying a grasping force to the probe 100. Spring members 198 and 200 apply an inwardly directed bias force to the two fingers 196. The gap between the stator 14 and the rotor 12 is generally in the range of one to two inches, suggesting use of a tool such as the tool 190 for positioning the flux probe, such as the probe 100 or 179, in the tooling wedge groove 104 after removing the generator end frame. Installation also requires reaching beyond the end turns 20 of the stator 14, illustrated in FIG. 1.

Although the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt the teachings of the present invention to a particular situation without departing from the invention's scope. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for measuring magnetic flux in a dynamoelectric machine, wherein the machine comprises a cylindrical stator core defining an annular opening and a plurality of radially inwardly directed teeth disposed on an opening circumference, and wherein two adjacent teeth define a cavity therebetween for receiving a stator coil and a wedge, and wherein the wedge comprises a radially inwardly directed face, and is frictionally engaged with opposed cavity sidewalls for retaining the stator coil in the slot, the apparatus comprising:
   a carrier;
   a flux probe mated to the carrier; and
   wherein carrier sidewalls are frictionally engaged with the opposed cavity sidewalls, and wherein the carrier is disposed radially inwardly relative to the radially inwardly directed face of the wedge.

2. The apparatus of claim 1 wherein the carrier is attached to either the opposed cavity sidewalls or the wedge face.

3. The apparatus of claim 1 wherein at least one of the cavity sidewalls further defines a groove therein, and wherein the carrier comprises at least one beveled side surface for positioning within the groove.

4. The apparatus of claim 1 wherein each of the opposed cavity sidewalls defines a groove therein, and wherein the carrier comprises two opposed beveled side surfaces each disposed within one of the opposed sidewall grooves.

5. The apparatus of claim 4 wherein each beveled side surface is bonded to a corresponding sidewall groove.

6. The apparatus of claim 1 wherein the cater is radially spaced-apart from the wedge, the apparatus further comprising a bladder disposed between a lower surface of the carrier and the wedge face, wherein the bladder receives a curable material that upon curing exerts a force against the carrier to retain the carrier within the slot.

7. The apparatus of claim 1 wherein the carrier comprises a plurality of linearly aligned segments each segment comprising a wedge-shaped surface for contacting a mating wedge-shaped surface of the adjacent segment, each segment further defining an axial opening therein for receiving a fastener, wherein application of an axially directed force to the fastener displaces the wedge-shaped surfaces from the linear alignment, such that a force is exerted against the opposed cavity sidewalls to retain the carrier within the slot.

8. A method for measuring magnetic flux in an electric generator wherein the generator comprises a cylindrical stator core defining an opening therein for receiving a rotor producing a magnetic field, and wherein the stator core further comprises a plurality of inwardly-directed coil slots disposed around a circumference of the opening, and wherein each slot defines a first pair of grooves disposed on opposing sidewalls of the coil slot, and wherein at least one coil is positioned in the coil slot and retained within the slot by a stator wedge disposed in the first pair of grooves, the method comprising:
   inserting a flux probe within a slot, wherein the flux probe is positioned radially inwardly from the wedge; and
   frictionally engaging the flux probe with the opposing sidewalls of the coil slot to retain the flux probe in the slot.

9. The method of claim 8 wherein the step of retaining comprises attaching the flux probe to a radially inwardly directed surface of the wedge.

10. The method of claim 8 wherein each slot father defines a second pair of grooves, and wherein the step of retaining comprises positioning the flux probe in the second pair of grooves for retaining the flux probe in the slot.

11. The method of claim 10 wherein the step of retaining further comprises bonding the flux probe to each of the second pair of grooves.

12. The method of claim 10 further comprising inserting a bladder in an opening formed between the flux probe and the wedge and injecting a curable material into the bladder such that upon curing the bladder exerts an inwardly directed force against the flux probe for retaining the flux probe in the slot.

13. The method of claim 8 wherein the flux probe is attached to a carrier, and wherein the method further comprises affixing the carrier to a radially inwardly directed surface of the wedge.

14. The method of claim 8 wherein the flux probe is attached to a carrier comprising a plurality of linearly aligned segments each segment further comprising a wedge-shaped surface for contacting a mating wedge-shaped surface of the adjacent segment, each segment further defining an axial opening therein for receiving a fastener, the method further comprising applying an axially directed force to the fastener to displace the wedge-shaped surfaces from linear alignment such that a force is exerted against the opposed cavity sidewalls to retain the carrier within the slot.

15. The method of claim 8 further comprising disengaging the flux probe form frictional engagement with the opposing sidewalls at a first axial position and axially displacing the flux probe within the slot from the first axial position to a second axial position to measure the magnetic flux at the second axial position.

* * * * *